(12) United States Patent
Iwadate et al.

(10) Patent No.: US 7,834,623 B2
(45) Date of Patent: Nov. 16, 2010

(54) MRI APPARATUS FOR ANALYZING BODY MOTION OF A SUBJECT

(75) Inventors: Yuji Iwadate, Tokyo (JP); Kenichi Kanda, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 137 days.

(21) Appl. No.: 12/015,833

(22) Filed: Jan. 17, 2008

(65) Prior Publication Data
US 2008/0211497 A1 Sep. 4, 2008

(30) Foreign Application Priority Data
Jan. 22, 2007 (JP) ............................. 2007-010937

(51) Int. Cl.
*G01V 3/00* (2006.01)
(52) U.S. Cl. ................................. 324/307
(58) Field of Classification Search ......... 324/300–322; 600/410–435
See application file for complete search history.

(56) References Cited

U.S. PATENT DOCUMENTS

| | | | | |
|---|---|---|---|---|
| 5,185,574 | A * | 2/1993 | Ehman et al. | 324/309 |
| 5,539,312 | A * | 7/1996 | Fu et al. | 324/309 |
| 5,977,769 | A * | 11/1999 | Bornert et al. | 324/306 |
| 6,268,730 | B1 * | 7/2001 | Du | 324/309 |
| 6,292,684 | B1 * | 9/2001 | Du et al. | 600/410 |
| 6,321,107 | B1 * | 11/2001 | Derbyshire | 600/410 |
| 6,587,707 | B2 * | 7/2003 | Nehrke et al. | 600/410 |
| 6,771,068 | B2 * | 8/2004 | Dale et al. | 324/307 |
| 6,777,935 | B2 * | 8/2004 | Nehrke et al. | 324/309 |
| 6,791,323 | B2 * | 9/2004 | Wang et al. | 324/309 |
| 6,894,494 | B2 | 5/2005 | Stergiopoulos et al. | |
| 6,957,097 | B2 | 10/2005 | Park et al. | |
| 7,127,092 | B2 * | 10/2006 | Jack et al. | 382/128 |
| 7,164,268 | B2 * | 1/2007 | Mugler et al. | 324/307 |
| 7,174,200 | B2 * | 2/2007 | Salerno et al. | 600/420 |
| 7,257,436 | B2 * | 8/2007 | Sasaki et al. | 600/428 |
| 7,358,732 | B2 * | 4/2008 | Van Der Kouwe et al. | 324/309 |
| 7,367,953 | B2 * | 5/2008 | Salla et al. | 600/508 |
| 7,423,430 | B1 * | 9/2008 | Sharif et al. | 324/309 |
| 7,432,706 | B2 * | 10/2008 | van der Kouwe | 324/306 |
| 7,448,381 | B2 * | 11/2008 | Sasaki et al. | 128/204.18 |
| 7,561,909 | B1 * | 7/2009 | Pai et al. | 600/410 |
| 2008/0281186 | A1 * | 11/2008 | Kuhara | 600/413 |
| 2008/0309333 | A1 * | 12/2008 | Stehning et al. | 324/307 |

FOREIGN PATENT DOCUMENTS

| | | |
|---|---|---|
| EP | 1369085 A1 | 12/2003 |
| JP | 05-049621 | 3/1993 |
| JP | 2002-028148 | 1/2002 |
| JP | 2006-026076 | 2/2006 |
| JP | 2006314491 A | 11/2006 |

OTHER PUBLICATIONS

China Patent Office, Second Office Action and Text of Second Office Action for Application No. 200810096374.2, Aug. 23, 2010, 5 pages, CN.

* cited by examiner

*Primary Examiner*—Melissa J Koval
*Assistant Examiner*—Dixomara Vargas
(74) *Attorney, Agent, or Firm*—Armstrong Teasdale LLP

(57) ABSTRACT

An MRI apparatus includes a navigator device for obtaining information of body motion produced by respiration of a subject by a navigator pulse sequence, and a respiration waveform display device for displaying a respiration waveform on the basis of the body motion information obtained by the navigator device.

13 Claims, 3 Drawing Sheets

_US 7,834,623 B2_

MRI APPARATUS FOR ANALYZING BODY MOTION OF A SUBJECT

CROSS REFERENCE TO RELATED APPLICATIONS

This application claims the benefit of Japanese Patent Application No. 2007-010937 filed Jan. 22, 2007.

BACKGROUND OF THE INVENTION

The field of the present invention relates to an MRI (Magnetic Resonance Imaging) apparatus and, more particularly, to an MRI apparatus enabling the operator to easily know body motion information of a subject without requiring a sensor such as a bellows, a pressure sensor, or an optical sensor and an MRI apparatus whose imaging parameters can be automatically optimized according to the body motion information of a subject.

An MRI apparatus is known, that obtains respiration information of a subject by using a sensor such as a bellows, a pressure sensor, or an optical sensor and performs imaging synchronously with respiration on the basis of the respiration information (refer to, for example, patent documents 1 and 2).

There is another known technique of detecting a body motion position of a subject by a navigator pulse sequence, predicting a body motion position at the time of a scan on the basis of the detected body motion position and a body motion approximate function, and controlling a slice position and a phase encoding amount in accordance with the predicted body motion position (refer to, for example, patent document 3).

Patent document 1. Japanese Unexamined Patent Publication No. Hei 05(1993)-049621.

Patent document 2. Japanese Unexamined Patent Publication No. 2002-028148.

Patent document 3. Japanese Unexamined Patent Publication No. 2006-26076.

The conventional arts in the patent document 1 and 2 have an advantage that, since the operator can easily know the body motion information of a subject obtained by a sensor such as a bellows, a pressure sensor, or an optical sensor, the operator can set parameters of a scan pulse sequence with reference to the body motion information.

However, there is a problem that a sensor such as a bellows, a pressure sensor, or an optical sensor is necessary, and the configuration is complicated.

On the other hand, the conventional art described in the patent document 3 does not have to use a sensor such as a bellows, a pressure sensor, or an optical sensor.

However, since the body motion information of the subject is not notified to the operator, there is a problem that the operator cannot set parameters of the scan pulse sequence with reference to the body motion information.

SUMMARY OF THE INVENTION

It is desirable that the problems described previously are solved.

According to a first aspect, the invention provides an MRI apparatus including: a navigator device for obtaining information of body motion produced by respiration of a subject by a navigator pulse sequence; and a respiration waveform display device for displaying a respiration waveform on the basis of the body motion information obtained by the navigator device.

Since the MRI apparatus according to the first aspect obtains body motion information of a subject by the navigator pulse sequence without requiring a sensor such as a bellows, a pressure sensor, or an optical sensor. Since a respiration waveform is generated and displayed on the basis of the obtained body motion information, the operator can set the parameters (for example, imaging time and imaging timing) of the scan pulse sequence with reference to the respiration waveform.

According to a second aspect, the invention provides an MRI apparatus including: a navigator device for obtaining information of body motion produced by respiration of a subject by a navigator pulse sequence; and a respiration cycle display device for displaying a respiration cycle on the basis of the body motion information obtained by the navigator device.

Since the MRI apparatus according to the second aspect obtains body motion information of a subject by the navigator pulse sequence, it is unnecessary to use a sensor such as a bellows, a pressure sensor, or an optical sensor. Since a respiration cycle is calculated and displayed on the basis of the obtained body motion information, the operator can set the parameters (for example, imaging time and imaging timing) of the scan pulse sequence with reference to the respiration cycle.

According to a third aspect, in the MRI apparatus according to the second aspect, the respiration cycle display device displays, as a respiration cycle, an average value of cycle time of body motion within predetermined time.

Since the MRI apparatus according to the third aspect uses, as a respiration cycle, an average value of the cycle time of the body motion within the predetermined time, even if the cycle time of the body motion slightly fluctuates, no inconvenience occurs.

According to a fourth aspect, the invention provides an MRI apparatus including: a navigator device for obtaining information of body motion produced by respiration of a subject by a navigator pulse sequence; and a number-of-respiration-times display device for displaying the number of respiration times per minute on the basis of the body motion information obtained by the navigator device.

Since the MRI apparatus according to the fourth aspect obtains body motion information of a subject by the navigator pulse sequence, it is unnecessary to use a sensor such as a bellows, a pressure sensor, or an optical sensor. Since the number of respiration times per minute is calculated and displayed on the basis of the obtained body motion information, the operator can set the parameters (for example, imaging time) of the scan pulse sequence with reference to the number of respiration times.

According to a fifth aspect, the invention provides an MRI apparatus including: a navigator device for obtaining information of body motion produced by respiration of a subject by a navigator pulse sequence; and an expiration time display device for displaying expiration time on the basis of the body motion information obtained by the navigator device.

Since the MRI apparatus according to the fifth aspect obtains body motion information of a subject by the navigator pulse sequence, it is unnecessary to use a sensor such as a bellows, a pressure sensor, or an optical sensor. Since the expiration time is calculated and displayed on the basis of the obtained body motion information, the operator can set the parameters (for example, imaging time) of the scan pulse sequence with reference to the expiration time.

According to a sixth aspect of the invention, in the MRI apparatus according to the fifth aspect, the expiration time display device uses, as expiration time, lapse time since a respiration waveform passes a predetermined position in an amplitude of a body motion from the inspiration side to the expiration side until the respiration waveform passes the predetermined position from the expiration side to the inspiration side.

The MRI apparatus according to the sixth aspect can calculate the expiration time on the basis of the amplitude of body motion.

According to a seventh aspect of the invention, in the MRI apparatus according to the fifth or sixth aspect, the expiration time display device displays an average value of expiration time within predetermined time.

Since the MRI apparatus according to the seventh aspect displays an average value of expiration time within predetermined time, even if the cycle time of the body motion slightly fluctuates, no inconvenience occurs.

According to an eighth aspect of the invention, in the MRI apparatus according to the fifth or sixth aspect, the expiration time display device displays the minimum value of expiration time within predetermined time.

Since the MRI apparatus according to the eighth aspect displays the minimum value of expiration time within predetermined time, imaging time can be prevented from becoming longer than the expiration time.

According to a ninth aspect of the invention, the MRI apparatus according to any of the first to eighth aspects further includes operating device used by the operator to enter an instruction for operating the navigator device.

The MRI apparatus according to the ninth aspect can allow the operator to execute the navigator pulse sequence at a desired timing.

According to a tenth aspect of the invention, the MRI apparatus according to any of the first to ninth aspects further includes warning device for notifying of a case where the body motion information of the subject obtained by the navigator device is determined as improper body motion information.

The MRI apparatus according to the tenth aspect can notifies the operator of a warning in the case such that the respiration of the subject is disturbed.

According to an eleventh aspect of the invention, the MRI apparatus according to the tenth aspect further includes parameter resetting device, in the case where the body motion information is improper, for enabling parameters of the navigator pulse sequence to be reset.

The MRI apparatus according to the eleventh aspect can reset the parameters of the navigator pulse sequence in the case such that the respiration of the subject is disturbed.

According to a twelfth aspect, the invention provides an MRI apparatus including: a navigator device for obtaining information of body motion produced by respiration of a subject by a navigator pulse sequence; and an imaging time optimizing device for optimizing imaging time on the basis of the body motion information obtained by the navigator device.

In the MRI apparatus according to the twelfth aspect, the imaging time is automatically optimized. Thus, the burden on the operator is lessened.

According to a thirteenth aspect of the invention, in the MRI apparatus according to the twelfth aspect, the imaging time optimizing device determines imaging time so that the body motion during the imaging time falls within a predetermined allowable value.

In the MRI apparatus according to the thirteenth aspect, the imaging time is automatically optimized so that the body motion during the imaging time falls within a predetermined allowable value. Thus, the burden on the operator is lessened, and artifacts caused by body motion can be suppressed.

According to a fourteenth aspect of the invention, in the MRI apparatus according to the thirteenth aspect, the imaging time optimizing device adjusts the number of slices in accordance with the optimized imaging time.

In the MRI apparatus according to the fourteenth aspect, the number of slices is automatically adjusted so as to be adapted to the optimized imaging time. Thus, the burden on the operator is lessened.

According to a fifteenth aspect, the invention provides an MRI apparatus including: a navigator device for obtaining information of body motion produced by respiration of a subject by a navigator pulse sequence; and an imaging timing optimizing device for optimizing imaging timing on the basis of the body motion information obtained by the navigator device and set imaging time.

In the MRI apparatus according to the fifteenth aspect, the imaging timing is automatically optimized, so that the burden on the operator is lessened.

According to a sixteenth aspect of the invention, in the MRI apparatus according to the fifteenth aspect, the imaging timing optimizing device determines imaging timing so that the body motion during the imaging time becomes the smallest.

In the MRI apparatus according to the sixteenth aspect, the imaging timing is automatically optimized so that the body motion during the imaging time becomes the smallest. Consequently, the burden on the operator is lessened, and artifacts caused by the body motion can be suppressed.

According to a seventeenth aspect of the invention, in the MRI apparatus according to any of the first to sixteenth aspects, the navigator pulse sequence is a pulse sequence of a line scan type, a pulse sequence of a 2D selective excitation type, or a pulse sequence of a phase contrast type.

The MRI apparatus according to the seventeenth aspect can excellently detect the motion of the diaphragm by using the existing navigator technique.

With the MRI apparatus of the invention, the operator can easily know the body motion information of a subject without necessity of using a detector such as a bellows, a pressure sensor, or an optical sensor. Since the imaging parameters are automatically optimized, the burden on the operator is lessened.

The MRI apparatus of the invention can be utilized for repiratory-gated imaging.

Further objects and advantages of the present invention will be apparent from the following description of the preferred embodiments of the invention as illustrated in the accompanying drawings.

BRIEF DESCRIPTION OF THE DRAWINGS

FIG. 4 is a diagram showing a method of calculating respiration cycle and the like.

DETAILED DESCRIPTION OF THE INVENTION

Figure 1:
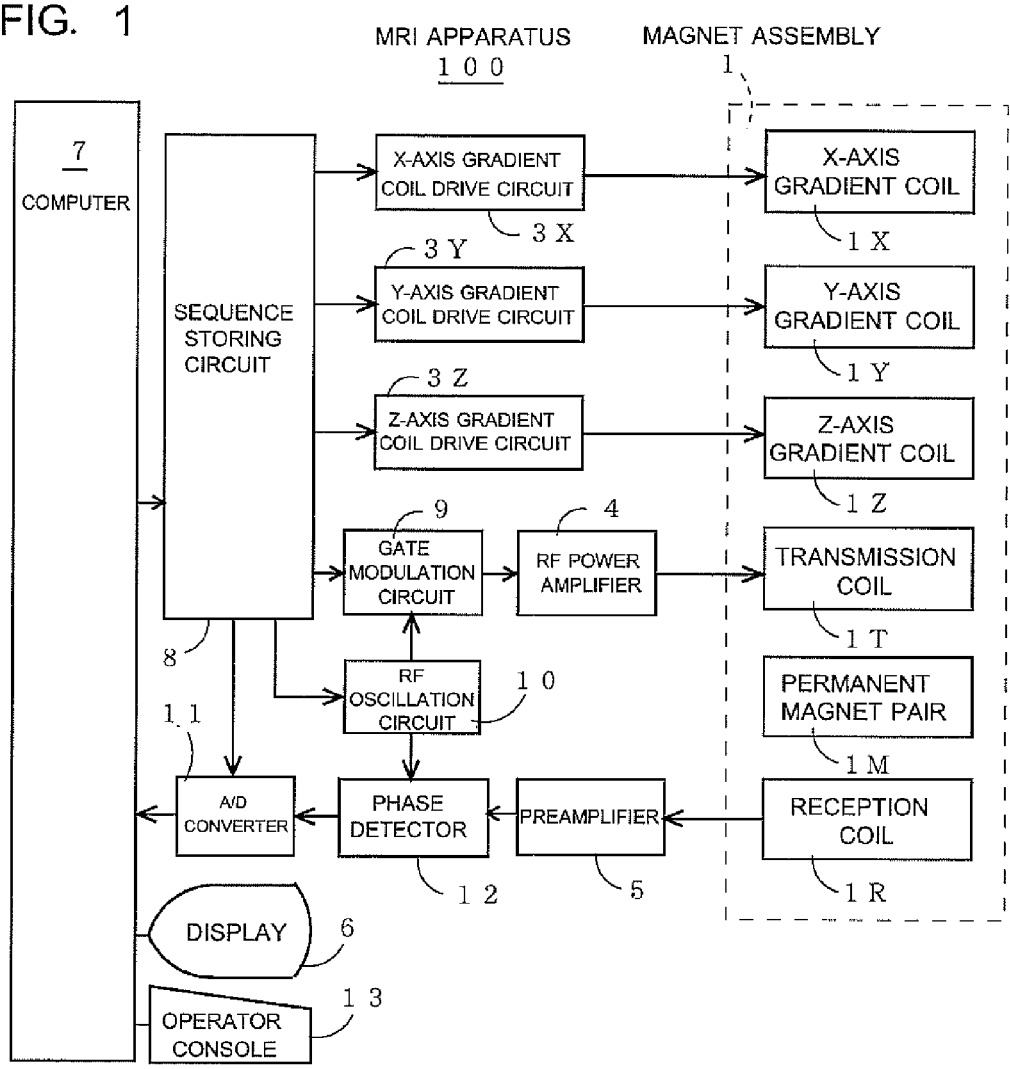
FIG. 1 is a block diagram showing a functional configuration of an MRI apparatus according to a first embodiment.

The invention will be described more specifically hereinbelow by embodiments shown in the drawings. The invention is not limited to the embodiments.

First Embodiment

FIG. 1 is a block diagram showing a functional configuration of an MRI apparatus 100 according to a first embodiment.

In the MRI apparatus 100, a magnet assembly 1 has therein a space (bore) for inserting a subject and includes, so as to surround the space, an X-axis gradient coil 1X for generating an X-axis gradient magnetic field, a Y-axis gradient coil 1Y for generating a Y-axis gradient magnetic field, a Z-axis gradient coil 1Z for generating a Z-axis gradient magnetic field, a transmission coil 1T for supplying an RF pulse for exciting spins of atomic nuclei in the subject, a reception coil 1R for detecting an NMR signal from the subject, and a permanent magnet pair 1M for generating a static magnetic field.

In place of the permanent magnet pair 1M, superconducting magnets may be used.

The X-axis gradient coil 1X is connected to an X-axis gradient coil drive circuit 3X. The Y-axis gradient coil 1Y is connected to a Y-axis gradient coil drive circuit 3Y. The Z-axis gradient coil 1Z is connected to a Z-axis gradient coil drive circuit 3Z. The transmission coil 1T is connected to an RF power amplifier 4.

The X-axis gradient coil drive circuit 3X includes an X-axis gradient amplifier. The Y-axis gradient coil drive circuit 3Y includes a Y-axis gradient amplifier. The Z-axis gradient coil drive circuit 3Z includes a Z-axis gradient amplifier. The RF power amplifier 4 includes an RF amplifier.

According to an instruction from a computer 7, a sequence storing circuit 8 operates the gradient coil drive circuits 3X, 3Y, and 3Z on the basis of the stored pulse sequence to make the gradient coils 1X, 1Y, and 1Z generate gradient magnetic fields. The sequence storing circuit 8 also operates a gate modulation circuit 9 to modulate a carrier wave output signal of an RF oscillation circuit 10 to a pulse signal having a predetermined envelope shape and a predetermined phase generated at a predetermined timing. The pulse signal is supplied as an RF pulse to the RF power amplifier 4 and power-amplified in the RF power amplifier 4. The amplified signal is applied to the transmission coil 1T.

The reception coil 1R is connected to a preamplifier 5.

The preamplifier 5 amplifies the NMR signal from the subject received by the reception coil 1R and supplies the amplified signal to a phase detector 12. The phase detector 12 detects the phase of the NMR signal from the preamplifier 5 from a reference signal output from the RF oscillation circuit 10, and outputs the signal to an A/D converter 11. The A/D converter 11 converts the analog signal subjected to the phase detection to digital data, and supplies the digital data to the computer 7.

The computer 7 performs general control on reception of information entered from an operator console 13 and the like, reads the digital data from the A/D converter 11, performs arithmetic process, generates an image, and displays the image and a message on a display device 6.

The computer 7 includes a CPU and a memory.

Figure 2:
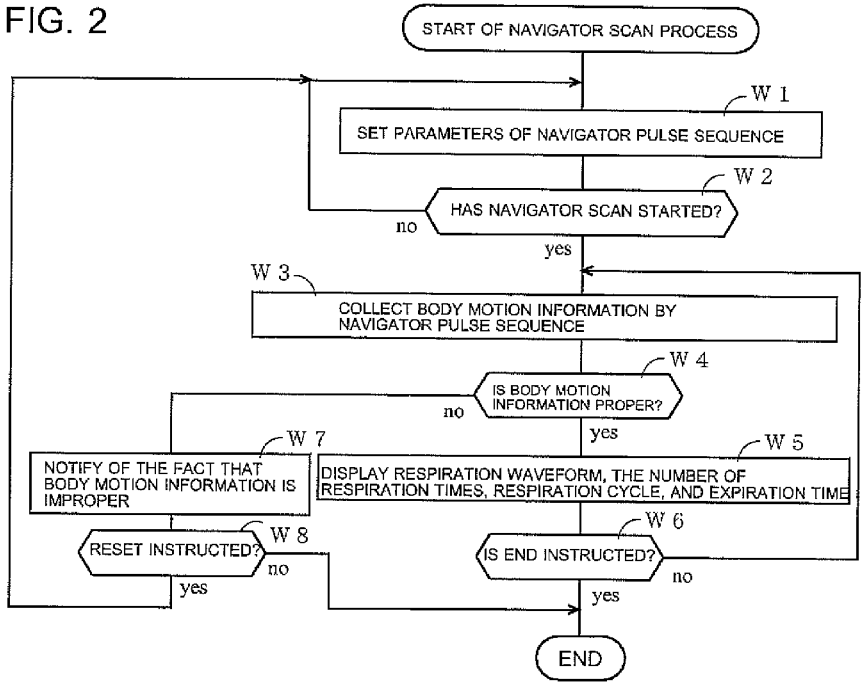
FIG. 2 is a flowchart showing navigator scan process according to the first embodiment.

FIG. 2 is a flowchart showing the procedure of navigator scan process performed by the MRI apparatus 100.

In step W1, parameters of a navigator pulse sequence are set including the type of the pulse sequence (for example, a pulse sequence of a line scan type, a pulse sequence of a 2D selective excitation type, or a pulse sequence of a phase contrast type), a space area to be excited (for example, a space near the diaphragm), and the like.

In step W2, a check is made to see whether start of the navigator scan is instructed by the operator using the operator console 13 or not. When the instruction is given, the routine advances to step W3. When the instruction is not given, the routine returns to step W1.

In step W3, information of body motion produced by respiration of a subject is obtained by the navigator pulse sequence.

In step W4, whether the obtained body motion information is proper or not is determined. When it is proper, the routine advances to step W5. When it is improper, the routine advances to step W7. For example, when the amplitude or cycle of the body motion is not too small or too large, the body motion information is determined as proper. In the other case, the body motion information is determined as improper.

Figure 3:
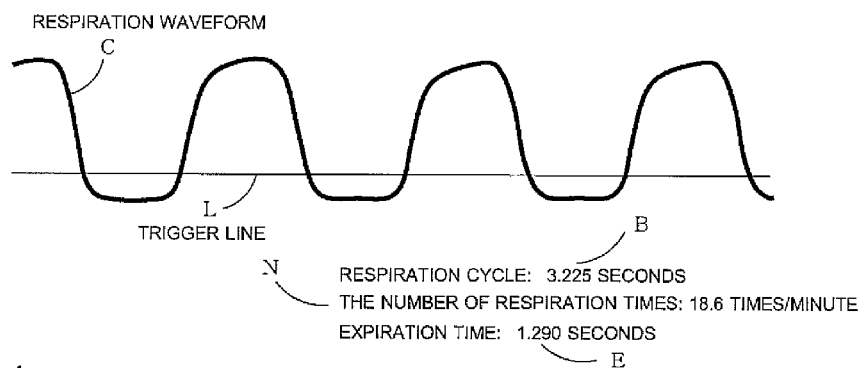
FIG. 3 is a schematic diagram that a respiration waveform and the like are displayed.

In step W5, for example, as shown in FIG. 3, a respiration waveform C, a trigger line L, respiration cycle B, the number N of respiration times, and expiration time E are displayed on the display device 6.

The respiration waveform C is, for example, a waveform of changes with time in the position of the diaphragm.

Figure 4:
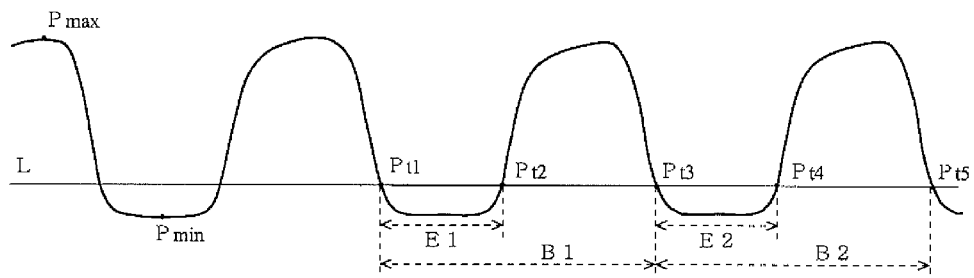

The trigger line L is, for example, a line dividing the portion between an inspiration-side maximum point Pmax and an expiration-side maximum point Pmin of the amplitude of the body motion as shown in FIG. 4 at 5:1.

The respiration cycle B is, for example, an average value of cycle time of the body motion in the latest 15 seconds. For example, a time interval B1 between time points Pt1 and Pt3 and a time interval B2 between time points Pt3 and Pt5 are cycle time of the body motion. At the points Pt1, Pt3, and Pt5, the respiration waveform C passes the trigger line L from the inspiration side to the expiration side.

The number N of respiration times is, for example, a quotient obtained by dividing one minute by the respiration cycle B.

The expiration time E is, for example as shown in FIG. 4, the average value or the minimum value of the latest 15 seconds of lapse time E1 and E2 since the respiration waveform C passes the trigger line L from the inspiration side of the body motion to the expiration side until the respiration waveform C passes the trigger line L from the expiration side to the inspiration side.

In step W6, a check is made to see whether end of the navigator scan has been instructed by the operator using the operator console 13 or not. When the instruction has been given, the process is finished. When the instruction has not been given yet, the routine returns to step W3.

In step W7, a message that the obtained body motion information is improper and a message inquiring whether the parameters of the navigator scan are reset or not are displayed on the display device 6.

When reset of the parameters of the navigator scan is instructed by the operator using the operator console 13 in step W8, the routine returns to step W1. When the end is instructed, the process is finished.

Figure 5:
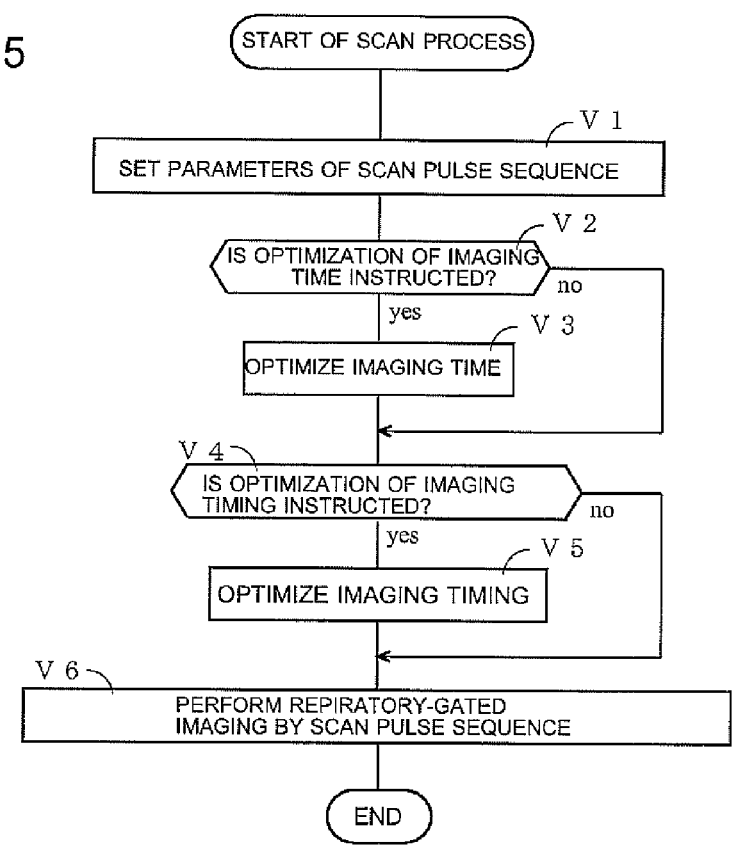
FIG. 5 is a flowchart showing scan process according to the first embodiment.

FIG. 5 is a flowchart showing the procedure of scan process performed by the MRI apparatus 100.

In step V1, with reference to the respiration waveform, trigger line, respiration cycles, the number of respiration times, and the expiration time displayed on the display device 6, the operator sets parameters of the scan pulse sequence such as imaging time, the number of slices, and imaging timings.

In step V2, a check is made to see whether optimization of the imaging time is instructed by the operator using the operator console 13 or not. When the optimization is instructed, the routine advances to step V3. When the optimization is not instructed, the routine advances to step V4.

Figure 6:
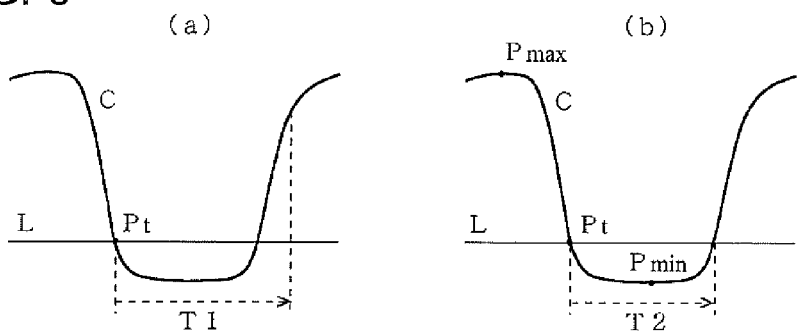
FIGS. 6A and 6B are diagrams showing optimization of imaging time.

In step V3, the imaging time is optimized. For example, in the case where imaging time T1 set by the operator covers the inspiration period and the expiration period as shown in FIG. 6A, the imaging time T1 is changed to imaging time T2 in which the respiration waveform C lies on the expiration side of the trigger line L as shown in FIG. 6B. By the change, the body motion in the imaging time T2 becomes within ⅙ (=allowable value) of the amplitude Pmax–Pmin. According to the imaging time T2, the number of slices, repetition time TR, and the like are adjusted.

It is also possible to determine an allowable value independently of the trigger line L and optimize the imaging time so that the body motion in the imaging time falls within the allowable value.

In step V4, a check is made to see whether optimization of the imaging timing is instructed by the operator using the operator console 13 or not. When the optimization is instructed, the routine advances to step V5. When the optimization is not instructed, the routine advances to step V6.

Figure 7:
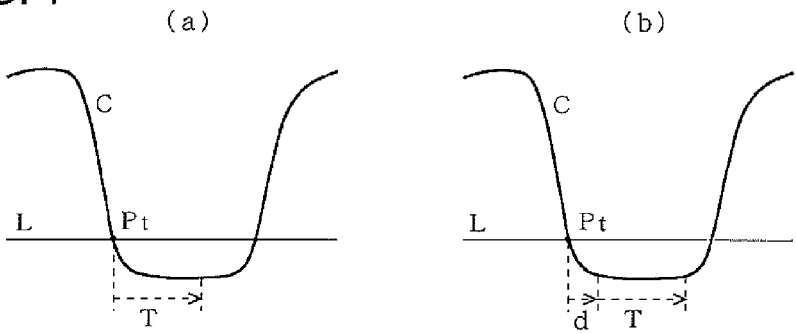
FIGS. 7A and 7B are diagrams showing optimization of an imaging timing.

In step V5, the imaging timing is optimized. For example, when the body motion in the imaging time T in the case where imaging starts after delay time "d" from the time point Pt as shown in FIG. 7B is smaller than that in imaging time T in the case when imaging starts at the time point Pt at which the respiration waveform C passes the trigger line L from the inspiration side of the body motion to the expiration side as shown in FIG. 7A, the imaging timing is changed so that imaging starts after the delay time "d" from the time point Pt. In such a manner, the body motion in the imaging time T can be minimized.

In step V6, imaging is performed synchronously with the respiration of the subject by the scan pulse sequence which is set or optimized. After that, the process is finished.

With the MRI apparatus 100 of the first embodiment, the following effects are obtained. First, it is unnecessary to use a sensor such as a bellows, a pressure sensor, or an optical sensor. Second, since the respiration waveform or the like is displayed, with reference to the display, the operator can set parameters of the scan pulse sequence. Third, the operator can execute the navigator pulse sequence at a desired timing. Fourth, in the case such that the respiration of the subject is disturbed during execution of the navigator pulse sequence, a warning can be given to the operator. Finally, since the imaging time and the imaging timing can be automatically optimized, the burden on the operation is lessened.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging (MRI) apparatus comprising:
    a navigator device configured to use a navigator pulse sequence in the MRI apparatus to obtain information of body motion produced by respiration of a subject;
    a respiration waveform display device configured to display a respiration waveform based on the body motion information obtained by the navigator device;
    and an operating device configured for use by an operator to enter an instruction for operating the navigator device based at least in part on the respiration waveform.

2. The MRI apparatus according to claim 1, further comprising a warning device configured to present a notification when the body motion information of the subject obtained by the navigator device is determined as improper body motion information.

3. The MRI apparatus according to claim 2, further comprising a parameter resetting device configured to enable parameters of the navigator pulse sequence to be reset when the body motion information is improper.

4. A magnetic resonance imaging (MRI) apparatus comprising:
    a navigator device configured to use a navigator pulse sequence in the MRI apparatus to obtain information of body motion produced by respiration of a subject;
    a respiration cycle display device configured to display a respiration cycle based on the body motion information obtained by the navigator device; and an operating device configured for use by an operator to enter an instruction for operating the navigator device based at least in part on the respiration cycle.

5. The MRI apparatus according to claim 4, wherein the respiration cycle display device is configured to display, as the respiration cycle, an average value of cycle time of the body motion within a predetermined time.

6. The MRI apparatus according to claim 4, further comprising a warning device configured to present a notification when the body motion information of the subject obtained by the navigator device is determined as improper body motion information.

7. A magnetic resonance imaging (MRI) apparatus comprising:
    a navigator device configured to use a navigator pulse sequence in the MRI apparatus to obtain information of body motion produced by respiration of a subject;
    a number-of-respiration-times display device configured to display a number of respiration times per minute based on the body motion information obtained by the navigator device; and an operating device configured for use by an operator to enter an instruction for operating the navigator device based at least in part on the number of respiration times per minute.

8. The MRI apparatus according to claim 7, further comprising a warning device configured to present a notification when the body motion information of the subject obtained by the navigator device is determined as improper body motion information.

9. A magnetic resonance imaging (MRI) apparatus comprising:
    a navigator device configured to use a navigator pulse sequence in the MRI apparatus to obtain information of body motion produced by respiration of a subject;
    an expiration time display device configured to display an expiration time based on the body motion information obtained by the navigator device; and an operating device configured for use by an operator to enter an instruction for operating the navigator device based at least in part on the expiration time.

10. The MRI apparatus according to claim 9, wherein the expiration time display device is configured to determine the expiration time based on a lapse time between a first time when a respiration waveform passes a predetermined position in an amplitude of the body motion from an inspiration side to an expiration side and a second time when the respiration waveform passes the predetermined position from the expiration side to the inspiration side.

11. The MRI apparatus according to claim 9, wherein the expiration time display device is configured to display an average value of the expiration time within a predetermined time.

12. The MRI apparatus according to claim 9, wherein the expiration time display device is configured to display a minimum value of the expiration time within a predetermined time.

13. The MRI apparatus according to claim 9, further comprising a warning device configured to present a notification when the body motion information of the subject obtained by the navigator device is determined as improper body motion information.

* * * * *